United States Patent
Van Ierssel et al.

(10) Patent No.: US 10,855,297 B2
(45) Date of Patent: Dec. 1, 2020

(54) PHASE ROTATOR NON-LINEARITY REDUCTION

(71) Applicant: Rambus Inc., Sunnyvale, CA (US)

(72) Inventors: Marcus Van Ierssel, Toronto (CA); Dominic Diclemente, Milton (CA)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/441,742

(22) Filed: Jun. 14, 2019

(65) Prior Publication Data

US 2020/0007137 A1 Jan. 2, 2020

Related U.S. Application Data

(60) Provisional application No. 62/690,833, filed on Jun. 27, 2018.

(51) Int. Cl.
*H03M 1/72* (2006.01)
*H03M 1/06* (2006.01)
*H03M 7/16* (2006.01)

(52) U.S. Cl.
CPC ............. *H03M 1/06* (2013.01); *H03M 7/165* (2013.01)

(58) Field of Classification Search
CPC ........ H03M 1/66; H03M 1/747; H03M 3/464; H03M 3/50; H03M 1/0665; H03M 3/504; H03M 1/0663; H03M 1/0836; H03M 1/0863; H03M 1/1255
USPC .......................... 341/135, 136, 144, 153, 154
See application file for complete search history.

(56) References Cited

U.S. PATENT DOCUMENTS

| | | | | |
|---|---|---|---|---|
| 4,306,225 A | * | 12/1981 | Geller | .................... H03M 1/72 341/153 |
| 5,231,396 A | * | 7/1993 | Yagi | ..................... H03M 1/785 341/118 |
| 6,114,921 A | * | 9/2000 | Aoki | ....................... H03C 1/545 332/103 |
| 6,891,428 B1 | * | 5/2005 | Zabroda | ............. H03M 1/0863 327/543 |
| 7,848,473 B2 | | 12/2010 | Freyman et al. | |
| 8,913,688 B1 | | 12/2014 | Jenkins | |
| 9,577,622 B2 | * | 2/2017 | Da Dalt | ................... H03K 5/13 |
| 2008/0191802 A1 | * | 8/2008 | Kinget | ..................... H03K 5/22 330/253 |
| 2009/0174587 A1 | * | 7/2009 | Ogawa | ................. H03K 17/687 341/144 |
| 2009/0195286 A1 | * | 8/2009 | Rylov | .................... H03H 11/20 327/237 |

(Continued)

*Primary Examiner* — Linh V Nguyen
(74) *Attorney, Agent, or Firm* — The Neudeck Law Firm, LLC

(57) ABSTRACT

A phase rotator receives control signals and thermometer coded signals that specifies the phase of an output signal. The phase rotator may be used, for example, by a clock and data recovery (CDR) circuit to continually rotate the phase of a clock to compensate for phase/frequency mismatches between received data and the clock. The control signals determine the phase quadrant (i.e., 0°-90°, 90°-180°, etc.) of the output signal. The thermometer coded signals determine the phase of the output signal within a quadrant by steering a set of bias currents between two or more nodes. The set of bias currents are selected to reduce the non-linearity between the thermometer coded value and the phase of the output signal.

17 Claims, 8 Drawing Sheets

(56) References Cited

U.S. PATENT DOCUMENTS

| | | | |
|---|---|---|---|
| 2015/0070065 A1* | 3/2015 | Dedic | H03K 5/1502 |
| | | | 327/254 |
| 2015/0222286 A1* | 8/2015 | Zhang | H03M 1/742 |
| | | | 341/143 |
| 2015/0326203 A1* | 11/2015 | Da Dalt | H03K 5/13 |
| | | | 327/237 |
| 2019/0222203 A1* | 7/2019 | Tripoli | G05F 1/577 |

* cited by examiner

PHASE ROTATOR NON-LINEARITY REDUCTION

DETAILED DESCRIPTION OF THE EMBODIMENTS

In an embodiment, a phase rotator receives control signals and thermometer coded signals that specifies the phase of an output signal. The phase rotator may be used, for example, by a clock and data recovery (CDR) circuit to continually rotate the phase of a clock to compensate for phase/frequency mismatches between received data and the clock. The control signals determine the phase quadrant (i.e., 0°-90°, 90°-180°, etc.) of the output signal. The thermometer coded signals determine the phase of the output signal within a quadrant by steering a set of bias currents between two or more nodes. The set of bias currents are selected to reduce the non-linearity between the thermometer coded value and the phase of the output signal.

Figure 1:
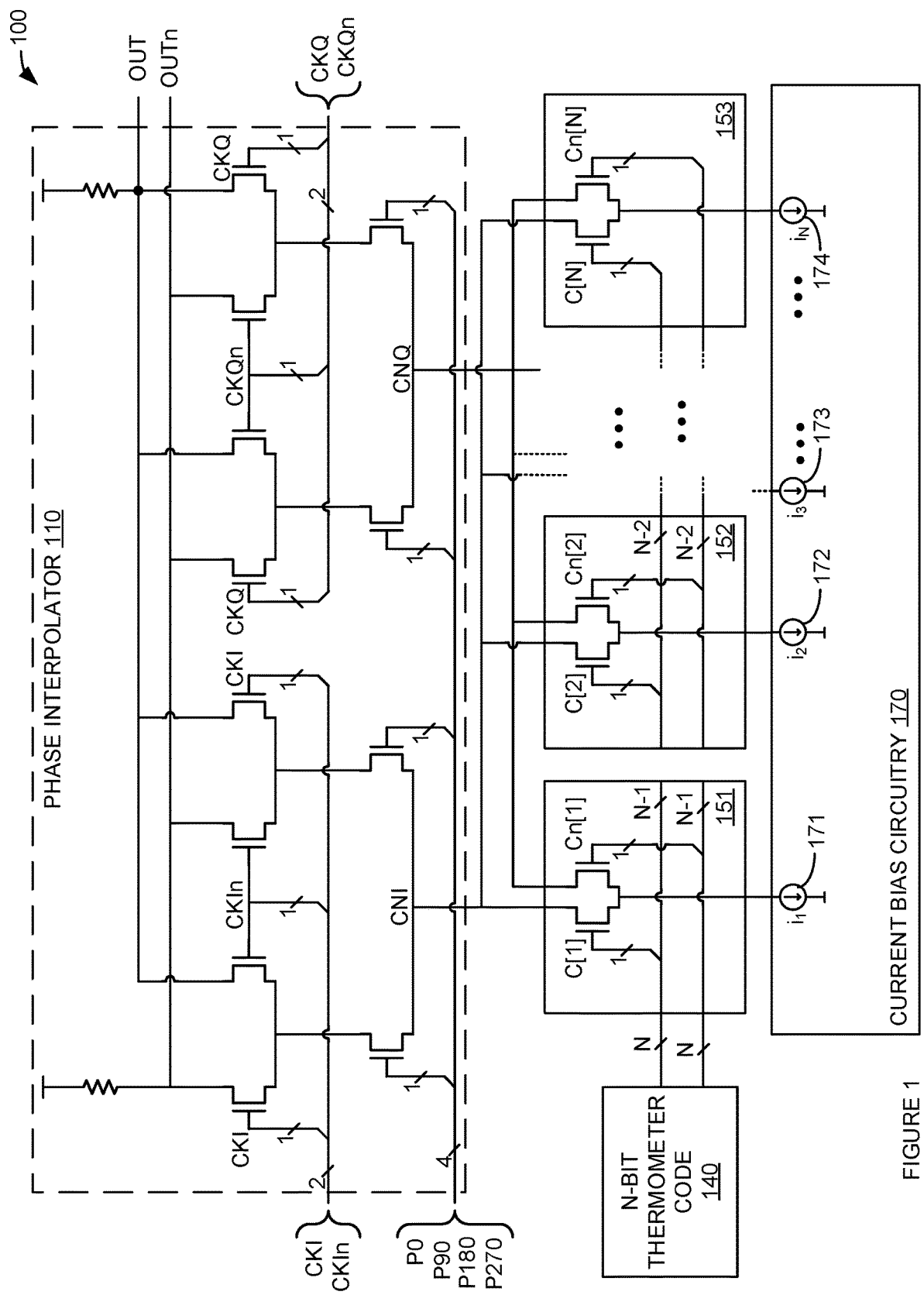
FIG. 1 is a block diagram illustrating phase rotator with reduced non-linearity.

FIG. 1 is a block diagram illustrating phase rotator with reduced non-linearity. In FIG. 1, phase rotator 100 comprises phase interpolator 110, steering circuits 151-153, and current bias circuitry 170. Current bias circuitry 170 includes N number of individual current biases 171-174 that are respectively connected to N number of current steering circuits 151-153.

Phase rotator 100 outputs differential clock signal OUT, OUTn. Phase interpolator 110 receives two clock signals CKI and CKQ. In FIG. 1, phase interpolator 110 uses current mode logic to combine the two clock signals CKI and CKQ into an output signal OUT. Other types of phase interpolators could be used. In the embodiment shown in FIG. 1, CKI and CKQ are differentially signaled as CKI, CKIn and CKQ, CKQn. Phase control signals P0, P90, P180, and P270 determine the phase quadrant of the output signal relative to the input clock signals.

An N number of bits (N-bit) thermometer code 140 received by phase rotator 100 determines the phase of the output signal within the selected quadrant. Each bit C[1]-C[N] of thermometer code 140 is applied to a respective current steering circuit 151-153. In response to the respective thermometer code bit, current steering circuits 151-153 steer respective current biases 171-174 between two nodes of phase interpolator 110. For example, thermometer code bit #1 (C[1],Cn[1]) determines whether the bias current $i_1$ is drawn from node CNI that is part of the CKI circuitry of phase interpolator 110, or from node CNQ that is part of the CKQ circuitry of phase interpolator 110. The current drawn from these the nodes CNI and CNQ of phase interpolator 110 determine the respective contributions that the phases of CKI and CKQ have on the output signal OUT.

Steering circuits 151-153 are configured as differential pairs. Thus, when a step in thermometer code 140 increases the current being pulled from CKI steering circuits 151-153 concurrently reduce the current being pulled from CKQ.

In an embodiment, the individual current biases 171-174 are not configured to each draw (or limit) the same amount of current. Rather, the current flowing through each individual current bias 171-174 is selected such that non-linearities in the relationship between the thermometer code 140 value and the phase of the output signal OUT are reduced.

The configuration of currents flowing through the individual current biases 171-174 may be adjusted to select a configuration that attempts to minimize on-linearities. For example, a difference between currents $i_1$ 171, $i_2$ 172, and $i_3$ 173 may be adjusted by control circuitry (not shown in FIG. 1) to equalize the difference in the phase of the output signal between the thermometer code values of '1000 . . . ', '1100 . . . ', and '1110 . . . '. In other words, if, before adjustment, the thermometer code value of '1000 . . . ' (i.e., steering circuit 151 is pulling $i_1$ from the CKI circuitry of and all the other steering circuits are pulling from CKQ), produces an output signal with a phase of 1°, the thermometer code value of '1100 . . . ', produces an output signal with a phase of 3° (2° difference between successive codes), and the thermometer code value of '1110 . . . ' produces an output signal with a phase of 4° (1° difference between successive codes), one or more of current biases 171-173 may be adjusted to produce, for example, a 1.5° difference from the '1000 . . . ' to the '1100 . . . ' code and also a 1.5° difference from the '1100 . . . ' to the '1110 . . . ' code.

Figure 2:
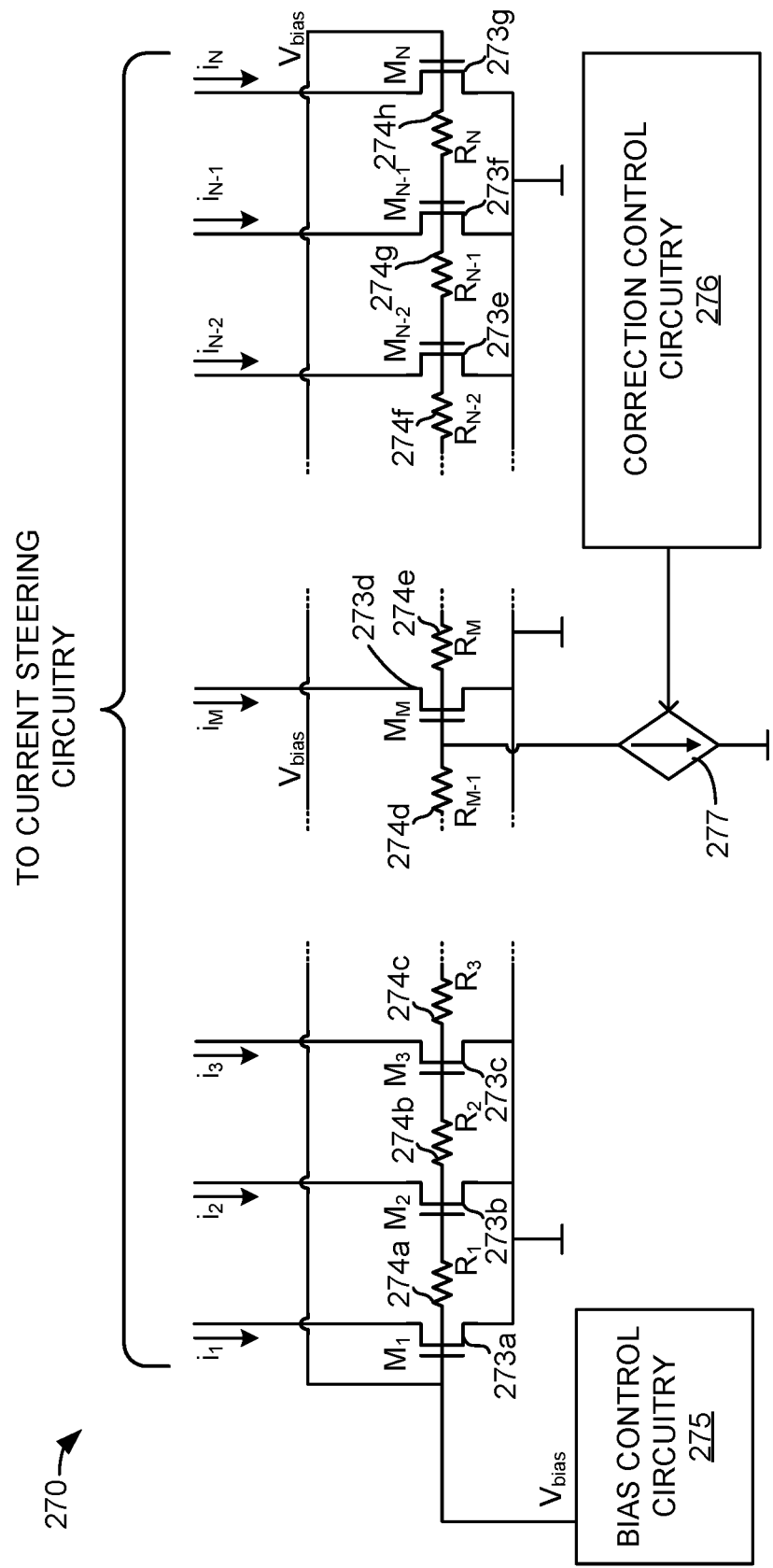
FIG. 2 is a block diagram illustrating current bias circuitry for a phase rotator with reduced non-linearity.

FIG. 2 is a block diagram illustrating a current bias circuit for a phase rotator with reduced non-linearity. In FIG. 2, current bias circuitry 270 comprises N number of current inputs $i_1$-$i_N$. Each current flowing into a current input $i_1$-$i_N$ is limited by a respective n-channel field effect transistor (NFET) $M_1$-$M_N$ 273a-273g. A midpoint current input $i_M$ is also shown. Midpoint current input $i_M$ is a one of current inputs $i_1$-$i_N$ that has, or most closely has, an equal number of other current inputs between itself ($i_M$) and the first input (i.e., $i_1$) and itself and the last (i.e., $i_N$) input. For example, if N=15, $i_M$ would be the $i_8$ input. If N=20 $I_M$ could be either the $i_{10}$ or $i_{11}$ input. It should also be understood from FIG. 2 that the current flowing into current input $i_M$ is limited by NFET $M_M$ 273d.

The drain of each NFET $M_1$-$M_N$ 273a-273g is connected to a respective current input $i_1$-$i_N$. Thus, the current that is allowed to flow into a respective current input $i_1$-$i_N$ is limited by the biasing of respective NFET $M_1$-$M_N$ 273a-273g. The sources of each NFET $M_1$-$M_N$ 273a-273g are connected to a power supply (e.g., negative power supply voltage—$V_{SS}$). Bias control circuitry 275 provides a bias voltage $V_{bias}$ to the gate of $M_1$ and $M_N$.

A resistive ladder network between $V_{bias}$ and the gate of $M_M$ sets the gate voltage of NFETs $M_2$-$M_{N-1}$. This resistive ladder network comprises resistive elements $R_1$-$R_N$ 274a-274h. $R_1$ 274a is connected between the gate of $M_1$ 273a and $M_2$ 273b; $R_2$ 274b is connected between the gate of $M_2$ 273b and $M_3$ 273c; and so on, with $R_N$ 274h begin connected between the gate of $M_{N-1}$ 273f and $M_N$ 273g.

A current source 277 is connected to draw current from the gate node of $M_M$ 273d. In an embodiment, current source 277 may be controlled by correction control circuitry 276. The current drawn by current source 277 is drawn from $V_{bias}$ through parallel resistive ladders. A first resistive ladder includes resistive elements $R_1$-$R_{M-1}$ 274a-274d. A second resistive ladder includes resistive elements $R_M$-$R_N$ 274e-274h. As the current drawn by current source 277 flows through the resistive elements $R_1$-$R_{M-1}$ 274a-274d of the first resistive ladder, the gate at each successive NFET $M_1$-$M_M$ 274a-274d is biased at a lower voltage than the preceding NFET $M_1$-$M_M$ 273a-273d. Likewise, as the current drawn by current source 277 flows through the resistive elements $R_N$-$R_M$ 274h-274e of the second resistive ladder, the gate at each successive NFET $M_N$-$M_M$ 273h-273d is biased at a lower voltage than the preceding NFET $M_N$-$M_M$ 273h-273d.

Figure 3:
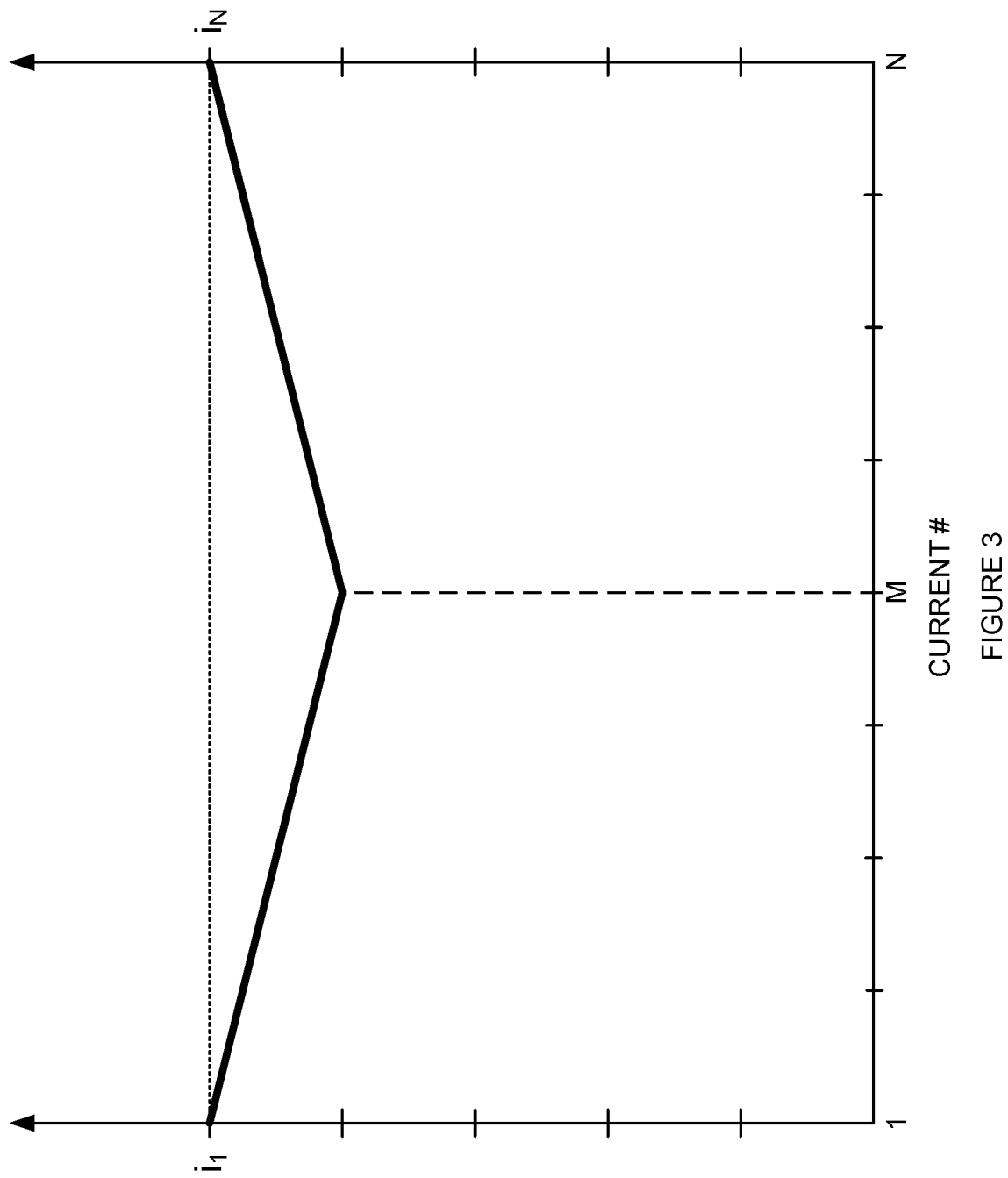
FIG. 3 illustrates an example profile of bias currents.

In an embodiment, each of the resistive elements $R_1$-$R_N$ 274a-274h has substantially the same resistance. Thus, $i_1$ and $I_N$ would be substantially the same, $i_2$ and $i_{N-1}$ would be substantially the same, $i_3$ and $i_{N-2}$ substantially the same, and so on. The minimum current would be $i_M$. The profile of the currents running from $i_1$ to $i_N$ in this configuration would have the shape of a "V" with $i_M$ being at the apex. FIG. 3 illustrates this example profile of bias currents.

Figure 4:
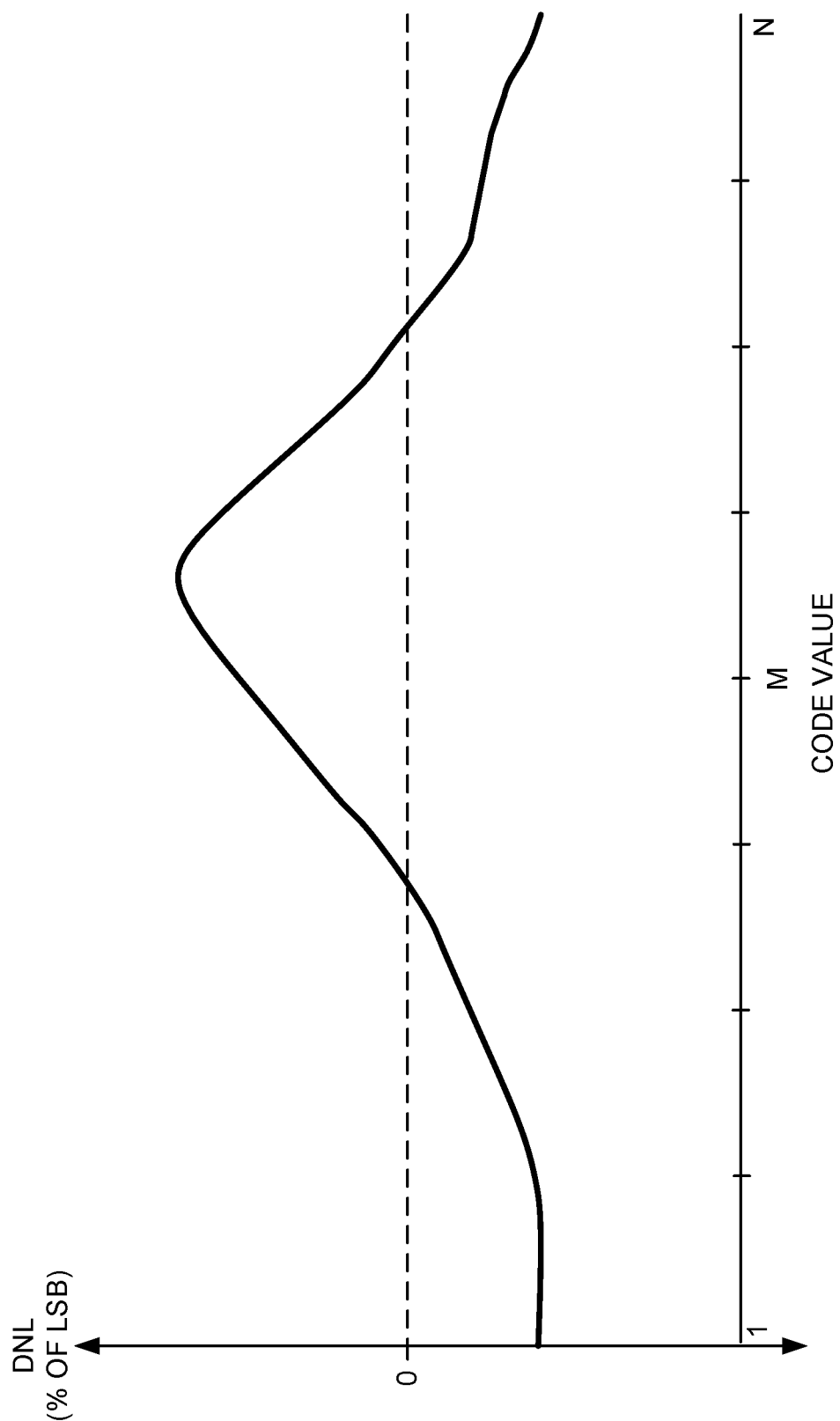
FIG. 4 illustrates differential phase rotator non-linearity.

FIG. 4 illustrates differential phase rotator non-linearity. In FIG. 4, the difference in non-linearity (as a percentage of a thermometer code bit) of successive thermometer code values is illustrated versus thermometer code value.

Figure 5:
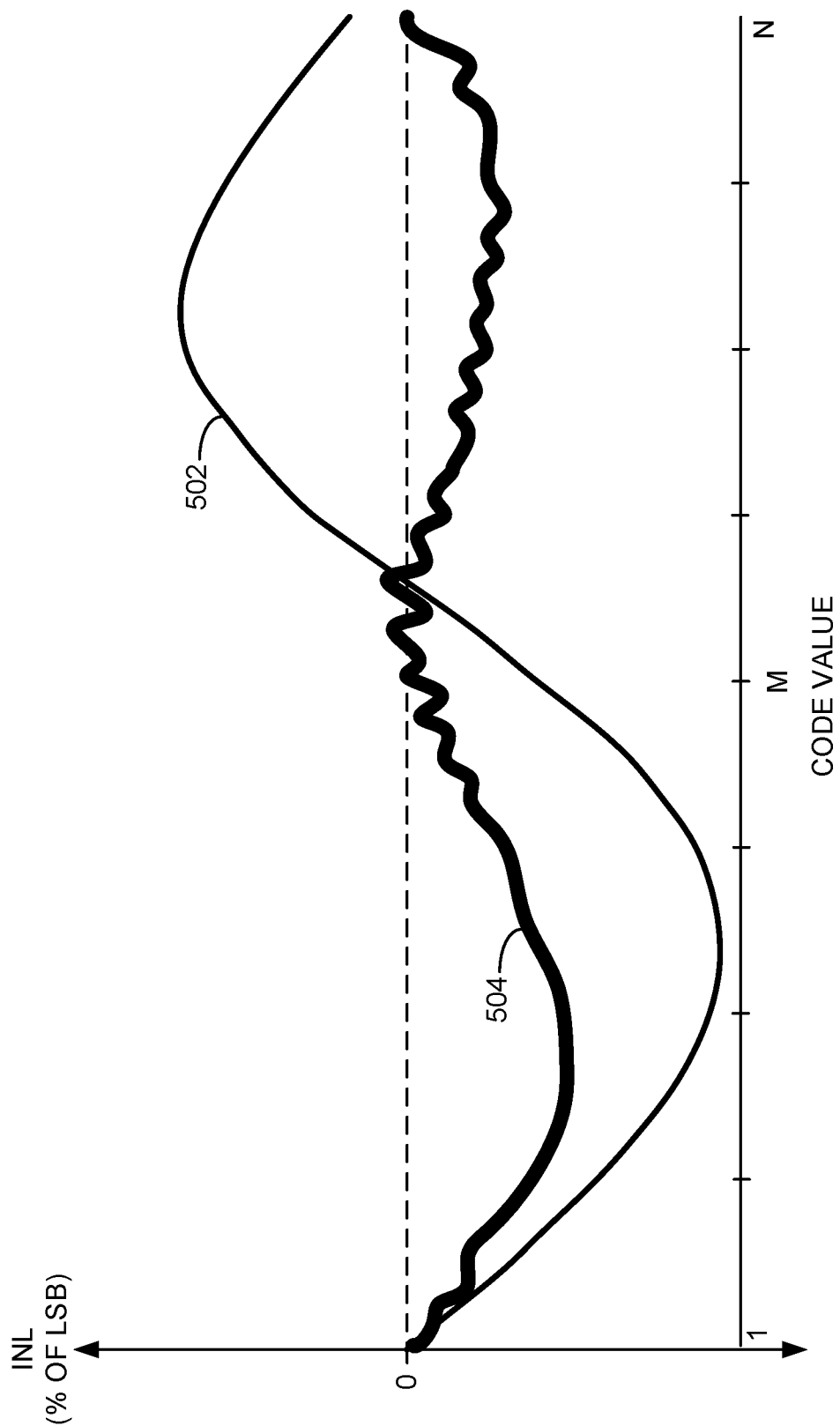
FIG. 5 illustrates phase unreduced and reduced phase rotator non-linearity.

Using the bias current profile created where each of the resistive elements $R_1$-$R_N$ 274a-274h has substantially the same resistance (illustrated in FIG. 4) reduces the phase rotator non-linearity. This is illustrated in FIG. 5. In FIG. 5, curve 502 approximates the non-linearity (as a percentage of a thermometer code bit) of successive thermometer code values when $i_1$-$i_N$ are all substantially equal. Curve 504 approximates the non-linearity when using the bias current circuitry illustrated in FIG. 2 and each of the resistive elements $R_1$-$R_N$ 274a-274h has substantially the same resistance. Note the improvement in the maximum non-linearity peaks shown by curve 504.

Adjusting current source 277 (e.g., by correction control circuitry 276) changes the shape of the curve illustrated in FIG. 4. In particular, the depth of the "V" and therefore the amount of current difference between successive biases can be adjusted by increasing or decreasing the amount of current through current source 277. Similarly, changing the resistance values of $R_1$-$R_N$ 274a-274h can be used to change the shape of the current profile (e.g., from a "V" to a "U", an offset "V", etc.)

Figure 6:
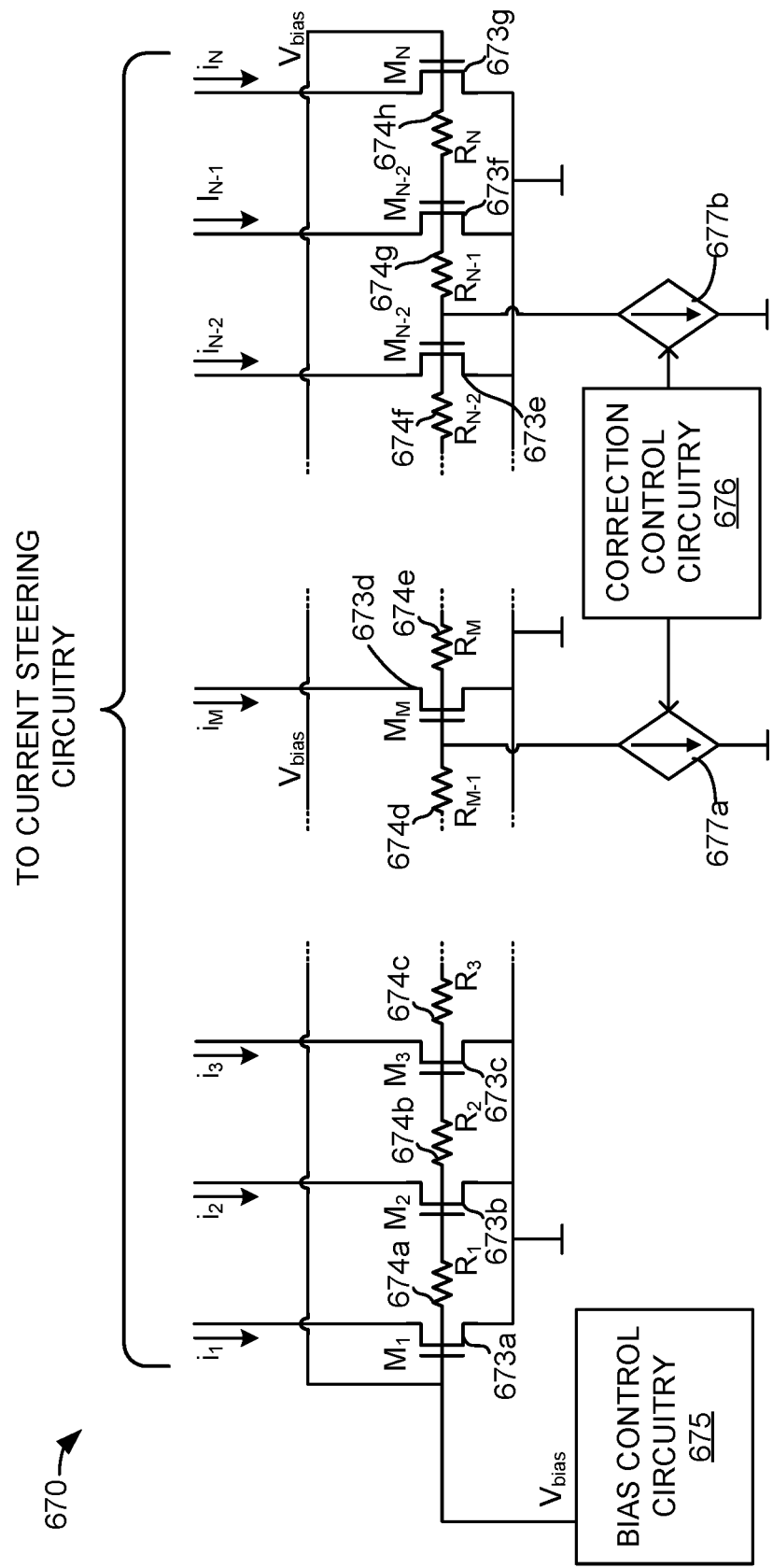
FIG. 6 is a block diagram of illustrating a current source bias capable of being configured to provide a complex bias current profile.

In an embodiment, additional controlled current sources can draw current from additional locations in the resistive element ladder(s). This is illustrated in FIG. 6. FIG. 6 is a block diagram of illustrating a current source bias capable of being configured to provide a complex bias current profile. In FIG. 6, current bias circuitry 670 comprises N number of current inputs $i_1$-$i_N$. Each current flowing into a current input $i_1$-$i_N$ is limited by a respective n-channel field effect transistor (NFET) $M_1$-$M_N$ 673a-673g. A midpoint current input $i_M$ is also shown. Midpoint current input $i_M$ is a one of current inputs $i$-$i_N$ that has, or most closely has, an equal number of other current inputs between itself ($i_M$) and the first input (i.e., $i_1$) and itself and the last (i.e., $i_N$) input. For example, if N=15, $i_M$ would be the $i_8$ input. If N=20 $I_M$ could be either the $i_{10}$ or $i_{11}$ input. It should also be understood from FIG. 6 that the current flowing into current input $i_M$ is limited by NFET $M_M$ 673d.

The drain of each NFET $M_1$-$M_N$ 673a-673g is connected to a respective current input $i_1$-$i_N$. Thus, the current that is allowed to flow into a respective current input $i_1$-$i_N$ is limited by the biasing of respective NFET $M_1$-$M_N$ 673a-673g. The sources of each NFET $M_1$-$M_N$ 673a-673g are connected to a power supply (e.g., negative power supply voltage—$V_{SS}$). Bias control circuitry 675 provides a bias voltage $V_{bias}$ to the gates of $M_1$ and $M_N$.

A resistive ladder network between $V_{bias}$ and the gate of $M_M$ sets the gate voltage of NFETs $M_2$-$M_{N-1}$. This resistive ladder network comprises resistive elements $R_1$-$R_N$ 674a-674h. $R_1$ 674a is connected between the gate of $M_1$ 673a and $M_2$ 673b; $R_2$ 674b is connected between the gate of $M_2$ 673b and $M_3$ 673c; and so on, with $R_N$ 674h begin connected between the gate of $M_{N-1}$ 673f and $M_N$ 673g.

In FIG. 6, a first current source 677a is connected to draw current from the gate node of $M_M$ 673d. A second current source 677b is connected to draw current from the gate of $M_{N-2}$. In an embodiment, current sources 677a-677b may be controlled by correction control circuitry 676. Having current source 677b draw current from the second resistive ladder alters the shape of the current profile such that it is no longer a "V". Thus, it should be understood that a number of current sources may be added and/or adjusted at various points in the resistive ladder(s) in order to create complex bias current profiles. These complex profiles may be created to further reduce non-linearities.

In an embodiment, phase rotator 100 is implemented on an integrated circuit. Current source bias circuitry 170 may be implemented using bias circuitry 270 or bias circuitry 670. Phase interpolator 110 is configured to receive two or more signals having different phases—e.g., CKI, CKQ. Current source bias circuitry 170 is connected to determine respective contributions CKI and CKQ have to a phase of output signal OUT.

Current source bias circuitry 170 comprises a plurality of switchable 151-153 current limiting circuits 171-174 controllable by a thermometer code 140. The plurality of switchable current limiting circuits 171-174 are biased to limit respective currents through respective current limiting circuits 171-174 to reduce a non-linearity in a relationship between the thermometer code 140 and the phase of the OUT signal.

In an embodiment, current bias circuitry 170 is implemented using bias circuitry 270. The resistances of resistive elements $R_1$-$R_N$ 274a-274h may be determined by the dimensions of resistive elements $R_1$-$R_N$ 274a-274h. Similarly, the currents flowing through each of NFETs $M_1$-$M_N$ 273a-273g may be determined, or at least affected, by the dimensions of NFETs $M_1$-$M_N$ 273a-273g (e.g., the width-to-length ratio of their gates.) The resistive ladders formed by resistive elements $R_1$-$R_N$ 274a-274h provide bias voltages for the gates of NFETs $M_1$-$M_N$ 273a-273g. Controllable current source 277 can adjust the bias voltages at the gates of NFETs $M_1$-$M_N$ 273a-273g. When $R_1$-$R_N$ 274a-274h are selected to have substantially equal resistances, the bias voltages at the gates of NFETs $M_1$-$M_N$ 273a-273g are linearly different from each other. When biased NFETs $M_1$-$M_N$ 273a-273g each substantially determine the current flowing through NFETs $M_1$-$M_N$ 273a-273g.

In an embodiment, phase interpolator 110 is biased by the current drawn from CNI and CNQ via steering circuits 151-153. Steering circuits 151-153 are controlled by thermometer code 140. Thus, thermometer code 140 controlled steering circuits 151-153 and current bias 170 may be viewed as a digital code to analog current converter circuitry. The currents $i$-$i_N$ steered by steering circuits 151-153 may be selected create a non-linear relationship between thermometer code 140 and the currents drawn from CNI and CNQ. This non-linear relationship between thermometer code 140 and the currents drawn from CNI and CNQ may reduce a non-linearity between thermometer code 140 and the phase of OUT.

Current bias circuitry 170 may be implemented using bias circuitry 270. Biased NFETs $M_1$-$M_N$ 273a-273g may be used as current limiting circuits. In other words, NFETs $M_1$-$M_N$ 273a-273g may be biased with a corresponding number of bias voltages that determine the respective current flowing through each individual NFET $M_1$-$M_N$ 273a-273g. These corresponding bias voltages at the gates of NFETs $M_1$-$M_N$ 273a-273g may be selected to reduce the non-linearity in the relationship between thermometer code 140 and the phase of OUT. In an embodiment, the corresponding bias voltages at the gates of NFETs $M_1$-$M_N$ 273a-273g, and the dimensions (e.g., width-to-length ratio) of NFETs $M_1$-$M_N$ 273a-273g may be selected to reduce the non-linearity in the relationship between thermometer code 140 and the phase of OUT.

In an embodiment, phase rotator 100 includes current bias circuitry 170. Current bias 170 is implemented using current bias 270. Current bias 270 includes controllable current source 277. Controllable current source 270 determines the currents flowing through the resistive ladders formed by the series connections of $R_1$-$R_N$ 274a-274h.

The resistive ladders formed by the series connections of $R_1$-$R_N$ 274a-274h determine the currents flowing through NFETs $M_1$-$M_N$ 273a-273g. In other words, NFETs $M_1$-$M_N$ 273a-273g can be viewed as current sources when biased by an appropriately by a selected $V_{bias}$, current source 270, and $R_1$-$R_N$ 274a-274h values. Steering circuits 151-153 steer the currents flowing through NFETs $M_1$-$M_N$ 273a-273g to/from parts of the current mode logic that makes up phase interpolator 110.

These steered currents form current biases for the current mode logic of phase interpolator 110. Phase interpolator 110 is configured to receive CKI and CKQ-which have different phases. The steered currents determine the respective contributions CKI and CKQ have on the phase of the OUT signal. The resistances of $R_1$-$R_N$ 274a-274h and/or the current source 270 are selected to at least partially compensate for a non-linear relationship between the phase of OUT and thermometer code 140.

Steering circuits 151-153 are configured as differential pairs. Thus, when a step in thermometer code 140 increases the current being pulled from CKI they concurrently reduce the current being pulled from CKQ.

Figure 7:
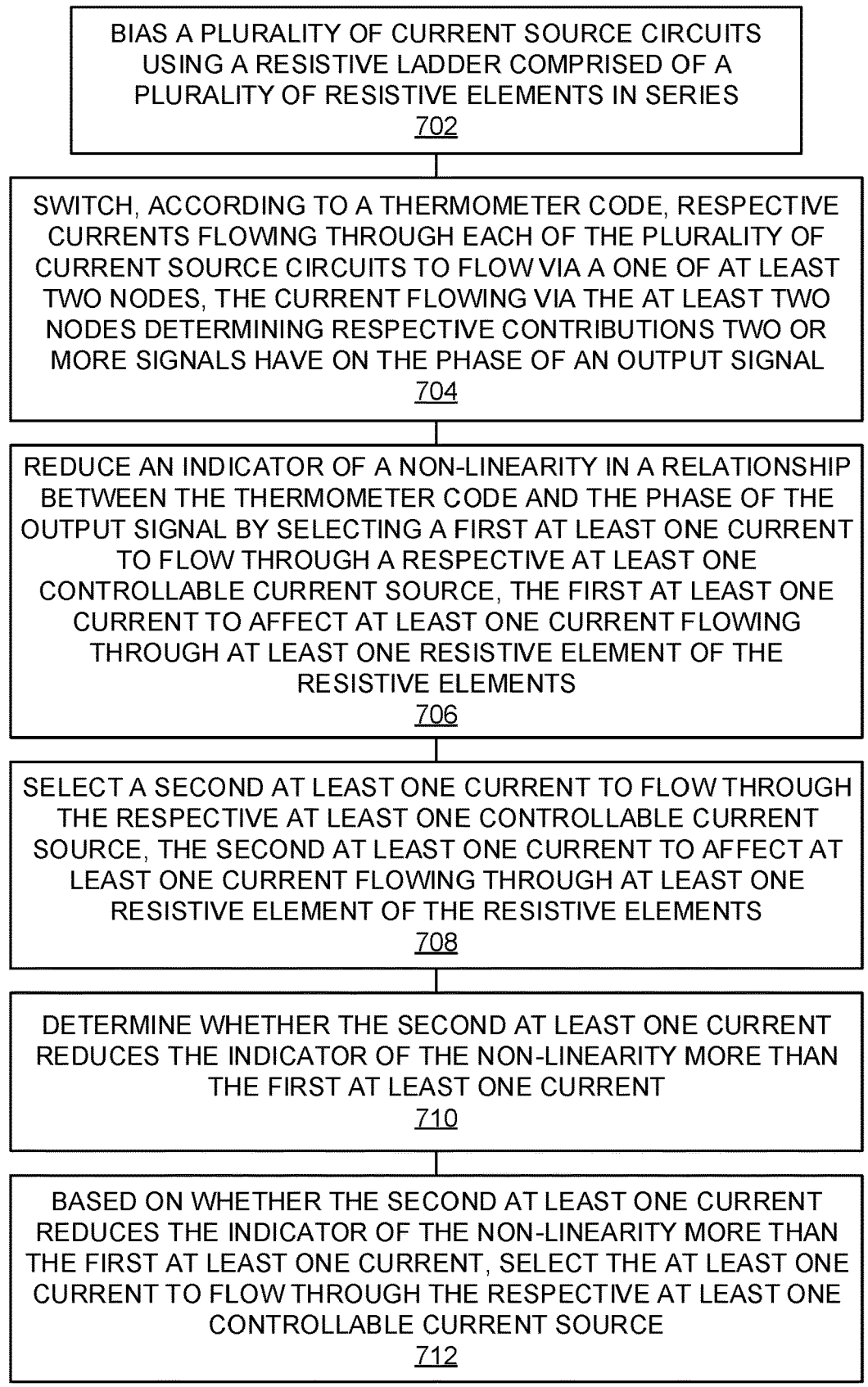
FIG. 7 is a flowchart illustrating a method of operating a phase rotator.

FIG. 7 is a flowchart illustrating a method of operating a phase rotator. The steps illustrated in FIG. 7 may be performed by one or more elements of phase rotator 100, bias circuitry 270, bias circuitry 670, and/or their components. A plurality of current source circuits are biased using a resistive ladder comprised of a plurality of resistive elements in series (702). For example, NFETs $M_1$-$M_N$ 273a-273g may be biased to conduct currents $i_1$-$i_N$ by resistive elements $R_1$-$R_N$ 274a-274h.

According to a thermometer code, respective currents flowing through each of the plurality of current source circuits are switched to flow via a one of at least two nodes. The current flowing via the at least two nodes determining respective contributions two or more signals have on the phase of an output signal (704). For example, steering circuits 151-153 may switch, according to thermometer code 140 the $i_1$-$i_N$ currents determined by the biasing of NFETs $M_1$-$M_N$ 273a-273g, between node CNI and CNQ that determine the respective contributions that the phases of CKI and CKQ have on the output signal OUT.

An indicator of a non-linearity in a relationship between the thermometer code and the phase of the output signal is reduced by selecting a first at least one current to flow through a respective at least one controllable current source. The first at least one current affecting at least one current flowing through at least on resistive element of the resistive elements (706). For example, correction control circuitry 276 may select a current to draw from the gate node of $M_M$273d. This selected current affects the current flowing through $R_1$-$R_N$ 274a-274h.

A second at least one current is selected to flow through the respective at least one controllable current. The second at least one current affecting at least one current flowing through at least on resistive element of the resistive elements (708). For example, correction control circuitry 276 may select a different current to draw from the gate node of $M_M$ 273d. This different current affects the current flowing through $R_1$-$R_N$ 274a-274h.

Whether the second at least one current reduces the indicator of non-linearity more that the first at least one current is determined (710). For example, the linearity of phase rotator 100 may be measured or simulated using each of the two selected currents and the results compared to determine which current provided more linearity. Based on whether the second at least on current reduces the indicator of the non-linearity more that the first at least one current, the at least one current is selected to flow through the respective at least one controllable current source (712). For example, based on the determination of which current provided more linearity, the current that provided more linearity may be selected for the operation of phase rotator 100.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of phase rotator 100, current bias 270, current bias 670, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 8:
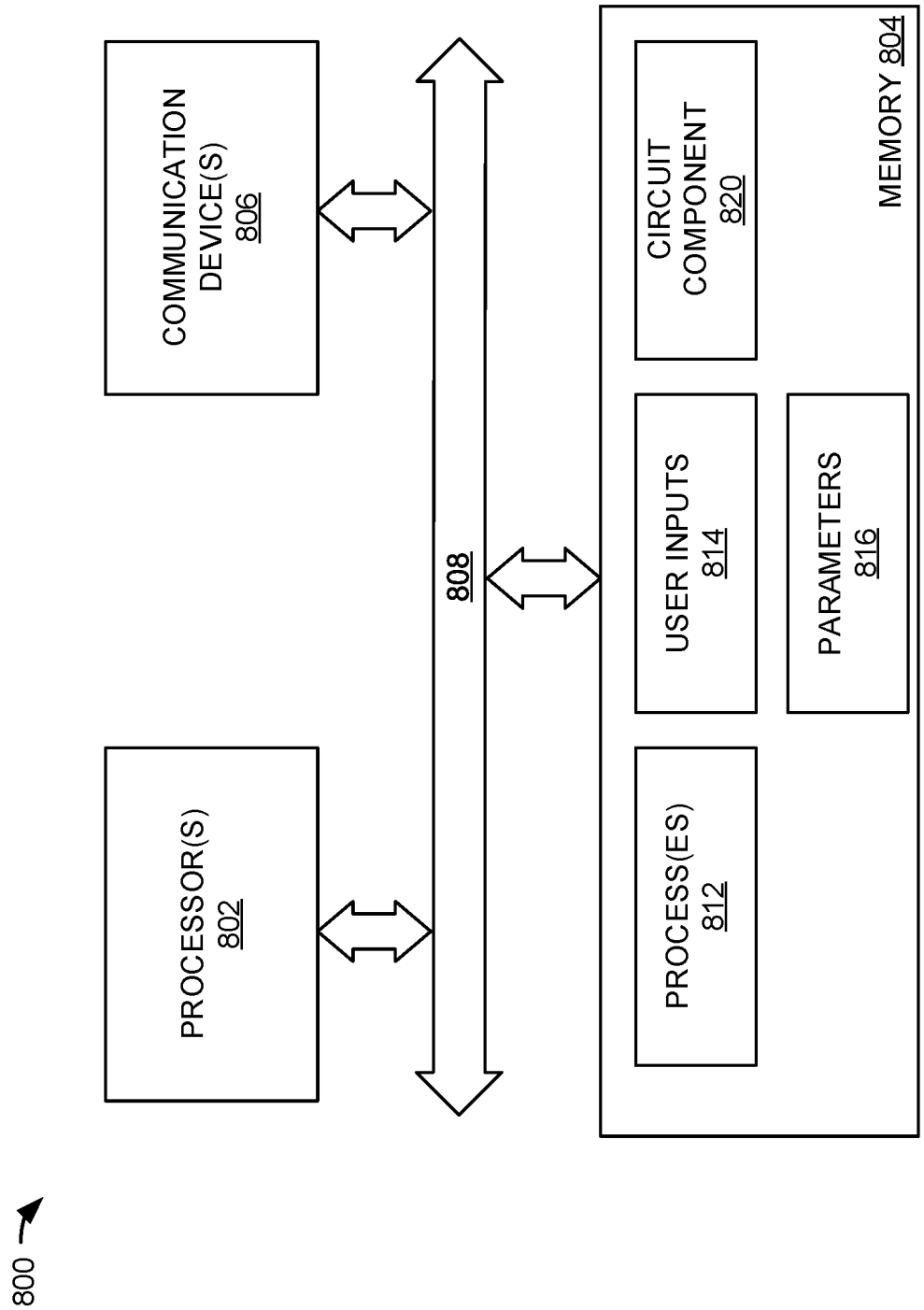
FIG. 8 is a block diagram of a processing system.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of phase rotator 100, current bias 270, current bias 670, and their components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
a phase interpolator configured to receive two or more signals having different phases;
current source bias circuitry connected to determine respective contributions the two or more signals have to a phase of an output signal, the current source bias circuitry comprising N number of switchable current limiting circuits controllable by an N-bit thermometer code, where N is greater than 3;
the N number of switchable current circuits to each be biased with respective limited currents controlled by respective current limiting circuits to reduce a non-linearity in a relationship between the thermometer code and the phase of the output signal; and,
the current limiting circuits to be biased by respective nodes of a resistive ladder network, a first current source to draw current from a node of the resistive ladder network that is not at an end of the resistive ladder network.

2. The integrated circuit of claim 1, wherein respective limited currents through respective current limiting circuits is at least partially determined by a dimensioning of a circuit element of the current limiting circuit.

3. The integrated circuit of claim 1, wherein the first current source is adjustable.

4. The integrated circuit of claim 3, wherein the first current source is adjustable to adjust an amount of current difference between successive values of the thermometer code.

5. The integrated circuit of claim 3, wherein the resistive ladder network is designed to provide bias voltages that are linearly different from each other.

6. The integrated circuit of claim 1, wherein the current limiting circuits each include a field-effect transistor that is controlled by a respective bias voltage on a respective node of the resistive ladder network to substantially determine the current flowing through the respective current limiting circuit.

7. The integrated circuit of claim 1, wherein the phase interpolator uses current mode logic.

8. An integrated circuit, comprising:
a phase interpolator biased by a selectable current, the phase interpolator configured to receive two or more signals having different phases and to produces an output signal having a phase; and,
digital code to analog current converter circuitry to determine the selectable current corresponding to the digital code, the selectable current provided for a given digital code using a resistive ladder network and to have a non-linear relationship that reduces a non-linearity in a relationship between the digital code and the phase of the output signal, the non-linear relationship to be adjustable by control circuitry that draws current from a node of the resistive ladder network that is not at an end of the resistive ladder network.

9. The integrated circuit of claim 8, wherein the digital code is to be provided as a thermometer code.

10. The integrated circuit of claim 9, wherein the analog current converter circuitry comprises a set of current switching circuits responsive to the thermometer code to allow a respective current to flow and to substantially block current from flowing.

11. The integrated circuit of claim 10, wherein a set of current limiting circuits each include a respective field-effect transistor that is biased to determine the respective current to flow.

12. The integrated circuit of claim 11, wherein each respective field-effect transistor has a respective gate node biased at a voltage selected to reduce the non-linearity in the relationship between the digital code and the phase of the output signal.

13. A phase rotator circuit, comprising:
- a first adjustable current bias to determine a current flowing from an internal node of a resistive ladder network;
- a plurality of current sources biased by the resistive ladder network, respective currents flowing through the plurality of current sources selectively, based on a digital code, steerable to produce a second current bias and a third current bias; and,
- a phase interpolator configured to receive two or more signals having different phases, the second current bias and the third current bias to determine respective contributions the two or more signals have to a phase of an output signal, respective resistances of the resistive ladder network and the adjustable current bias to bias the current sources to at least partially compensate for a non-linear relationship between the phase of the output signal and the digital code.

14. The integrated circuit of claim 13, wherein a step in the digital code that increases the second current bias by an amount also decreases the third current bias by the amount.

15. The integrated circuit of claim 14, wherein an increase in the first current bias increases the amount.

16. The integrated circuit of claim 15, wherein the plurality of current sources each include a field-effect transistor having a gate biased by a respective node of the resistive ladder network.

17. The integrated circuit of claim 15, wherein the resistive ladder network produces a second current bias that is minimized at a midpoint of the thermometer code.

* * * * *